(12) United States Patent
    Chern

(10) Patent No.: US 9,502,581 B2
(45) Date of Patent: Nov. 22, 2016

(54) NON-VOLATILE FLOATING GATE MEMORY CELLS

(71) Applicant: Atmel Corporation, San Jose, CA (US)

(72) Inventor: Geeng-Chuan Chern, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 124 days.

(21) Appl. No.: 14/328,938

(22) Filed: Jul. 11, 2014

(65) Prior Publication Data

US 2016/0013310 A1    Jan. 14, 2016

(51) Int. Cl.
*H01L 21/8249* (2006.01)
*H01L 29/788* (2006.01)
*H01L 29/40* (2006.01)
*H01L 29/49* (2006.01)
*H01L 21/28* (2006.01)
*H01L 29/423* (2006.01)
*H01L 27/115* (2006.01)
*G11C 16/04* (2006.01)

(52) U.S. Cl.
CPC ....... *H01L 29/788* (2013.01); *H01L 21/28273* (2013.01); *H01L 27/11521* (2013.01); *H01L 29/401* (2013.01); *H01L 29/42324* (2013.01); *H01L 29/4916* (2013.01); *H01L 29/7883* (2013.01); *G11C 16/0483* (2013.01)

(58) Field of Classification Search
CPC ............... H01L 29/788; H01L 29/401; H01L 29/4916; H01L 21/28273; H01L 27/11521; H01L 21/7883
USPC .......................................... 438/211, 263, 264
See application file for complete search history.

(56) References Cited

U.S. PATENT DOCUMENTS

| | | | |
|---|---|---|---|
| 4,314,265 A | 2/1982 | Simko | |
| 4,486,769 A | 12/1984 | Simko | |
| 4,599,706 A | 7/1986 | Guterman | |
| 4,752,912 A | 6/1988 | Guterman | |
| 4,757,360 A | 7/1988 | Faraone | |
| 4,947,221 A | 8/1990 | Stewart et al. | |
| 5,029,130 A | 7/1991 | Yeh | |
| 5,268,319 A | 12/1993 | Harari | |
| 5,324,676 A | 6/1994 | Guterman | |
| 5,544,103 A | 8/1996 | Lambertson | |
| 5,597,751 A | 1/1997 | Wang | |
| 5,780,892 A | 7/1998 | Chen | |
| 6,563,167 B2 | 5/2003 | Chern | |
| 6,706,592 B2 | 3/2004 | Chern et al. | |
| 6,750,090 B2 | 6/2004 | Chern | |
| 6,967,372 B2 | 11/2005 | Chern | |
| 7,008,846 B2 | 3/2006 | Chern | |
| 2002/0110985 A1* | 8/2002 | Tseng ................ H01L 29/42324 438/268 |
| 2003/0073291 A1* | 4/2003 | Tseng ................ H01L 21/76224 438/296 |
| 2008/0093647 A1* | 4/2008 | Kang .................. H01L 29/7887 257/314 |

* cited by examiner

*Primary Examiner* — Kevin M Picardat
(74) *Attorney, Agent, or Firm* — Fish & Richardson P.C.

(57) ABSTRACT

A storage transistor for non-volatile memory can be fabricated to create controlled sharp polycrystalline silicon (polysilicon) edges. The edges concentrate the electric field in the storage transistor and are used to enhance tunneling between layers of polysilicon for both program and erase operations. The storage transistor includes first and second polysilicon layers and a tunneling dielectric layer between the first and second polysilicon layers, and the second polysilicon layer includes at least a first edge extending towards the first polysilicon layer.

20 Claims, 22 Drawing Sheets

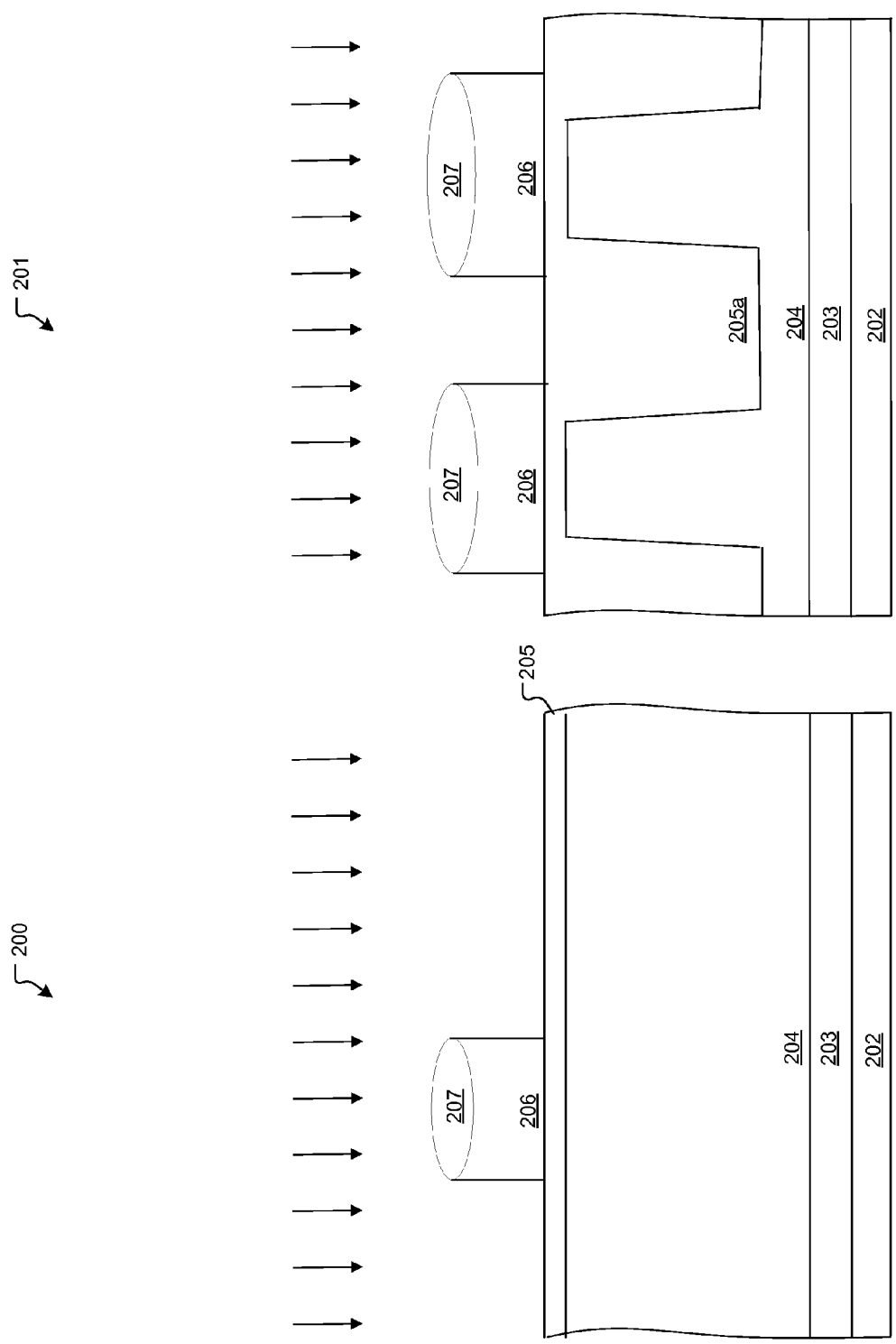

NON-VOLATILE FLOATING GATE MEMORY CELLS

TECHNICAL FIELD

This disclosure relates generally to floating gate memory cells for non-volatile memory.

BACKGROUND

Non-volatile memory can be implemented using a storage transistor having a floating gate. The floating gate is located between a control gate and a substrate, and unlike the control gate, the floating gate is typically not connected to a word or bit line. The logic state of the storage transistor can be altered by injecting electrons into or removing electrons from the floating gate to cause a substantial shift in the threshold voltage of the storage transistor and thus, turn the storage transistor ON or OFF. For positive logic, the state of the storage transistor is referred to as "1" or "0" state when it is ON or OFF, respectively. On the other hand, the state of the storage transistor is referred to as "1" or "0" state when it is OFF or ON, respectively, for negative logic. Typically, conventional electrically erasable programmable read-only memories (EEPROMs) are negative logic, and erasable programmable read only memories (EPROMs) or Flash Memories are positive logic.

Under high gate voltages, electrons can tunnel through tunnel dielectric layers, e.g., silicon dioxide, to move into or out of the floating gate. Hot electron injection requires both high gate and high drain voltage to gain sufficient energy to jump the silicon-silicon dioxide energy barrier, penetrating the oxide and flowing to the floating gate, which is surrounded by an oxide layer.

SUMMARY

A storage transistor for non-volatile memory can be fabricated to create controlled sharp polycrystalline silicon (polysilicon) edges. The edges concentrate the electric field in the storage transistor and are used to enhance tunneling between layers of polysilicon for both program and erase operations. The storage transistor includes first and second polysilicon layers and a tunneling dielectric layer between the first and second polysilicon layers, and the second polysilicon layer includes at least a first edge extending towards the first polysilicon layer. The first polysilicon layer can include an edge extending towards the second polysilicon layer. The storage transistor can be used in negative logic memories. The storage transistor can use enhanced Fowler-Nordheim tunneling for both removing electrons from and injecting electrons into the floating gate.

Particular implementations of the storage transistors can provide one or more of the following advantages: 1) sharp polysilicon edges can be formed to enhance inter-poly tunneling for both program and erase operations; 2) memory cell sizes can be reduced which can reduce the cost of producing memory systems; and 3) due to an enhanced tunneling effect, tunneling dielectric layers can be made thicker, resulting in improved reliability.

BRIEF DESCRIPTION OF THE DRAWINGS

FIGS. 2A-2L illustrate a process for fabricating a storage transistor having controlled sharp polysilicon edges to enhance inter-poly tunneling for program and erase operations.

DETAILED DESCRIPTION

Figure 1A:
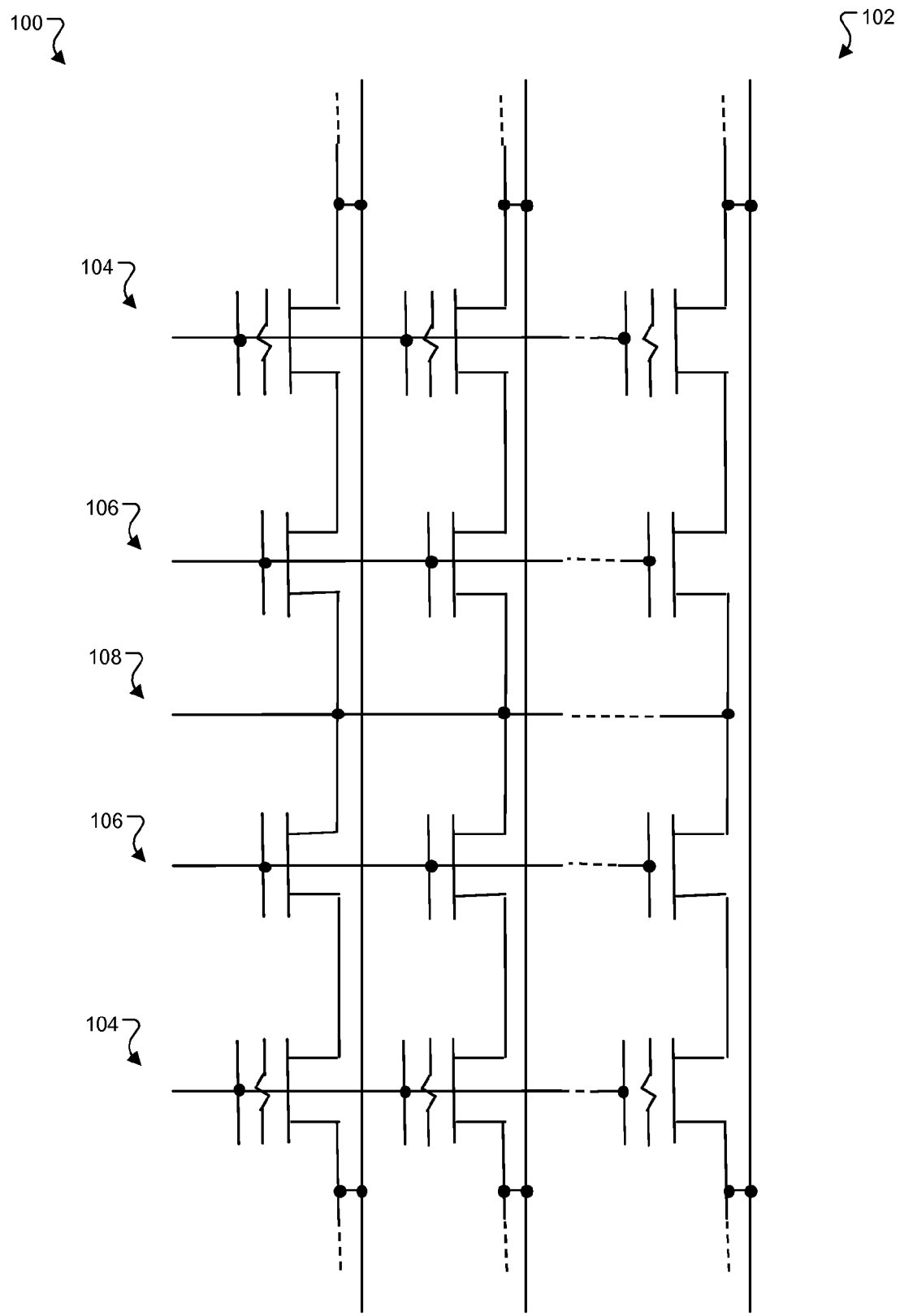
FIG. 1A is an electrical diagram of an example memory array including storage transistors.

FIG. 1A is an electrical diagram of an example memory array 100 including storage transistors. The memory array 100 can be used in any appropriate non-volatile memory system, e.g., in an electrically erasable programmable read-only memory (EEPROM) system or a serial EEPROM system.

The memory array 100 includes bit lines 102, sense lines 104 coupled to sense gates, select lines 106 coupled to select gates, and source lines 108. In operation, a memory system applies appropriate signals to the bit lines 102 and select lines 106 to select individual memory cells. The memory system can read from the memory cells, program the memory cells, or erase the memory cells. The memory cells can be implemented using the storage transistors described further below.

Figure 1B:
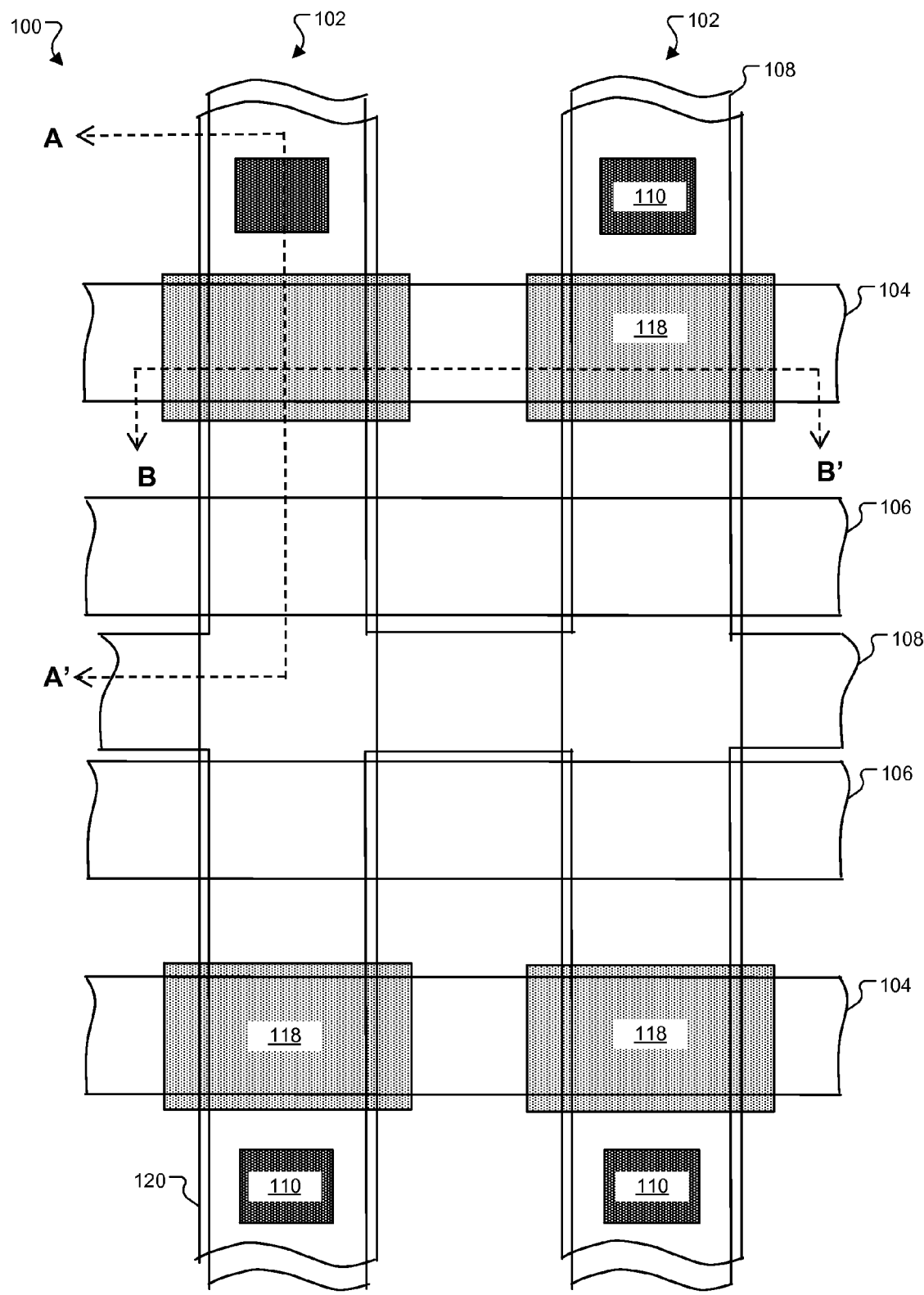
FIG. 1B is a top view of the example memory array that illustrates an example implementation of the memory array.

FIG. 1B is a top view of the example memory array 100 that illustrates an example implementation of the memory array. The memory array includes bit lines 102 and contacts 110. The memory array includes floating gates 118, which can be implemented using a first layer of polysilicon. The memory includes sense gates 104 and select gates 106, which can be implemented using a second layer of polysilicon. The memory array also includes a source line 108 and a metal layer 120. The source line can be an active (i.e., diffusion) layer which also includes transistor channels and source and drain areas. The bit lines 102 are formed by the metal layer 120. FIG. 1B also illustrates two view planes by dotted lines, including a first line from A to A' and a second line from B to B'.

FIGS. 2A-2L illustrate a process for fabricating a storage transistor having controlled sharp polysilicon edges to enhance inter-poly tunneling for program and erase operations. Each figure shows the storage transistor at a different stage during fabrication. The figures show the storage transistor from two different views 200 and 201. Referring back to FIG. 1B, the views 200 of the left side of the figures illustrate a cross sectional view of the storage transistor along the first line from A to A', and the views 201 of the right side of the figures illustrate a cross sectional view of the storage transistor along the second line from B to B'.

Figure 2A:
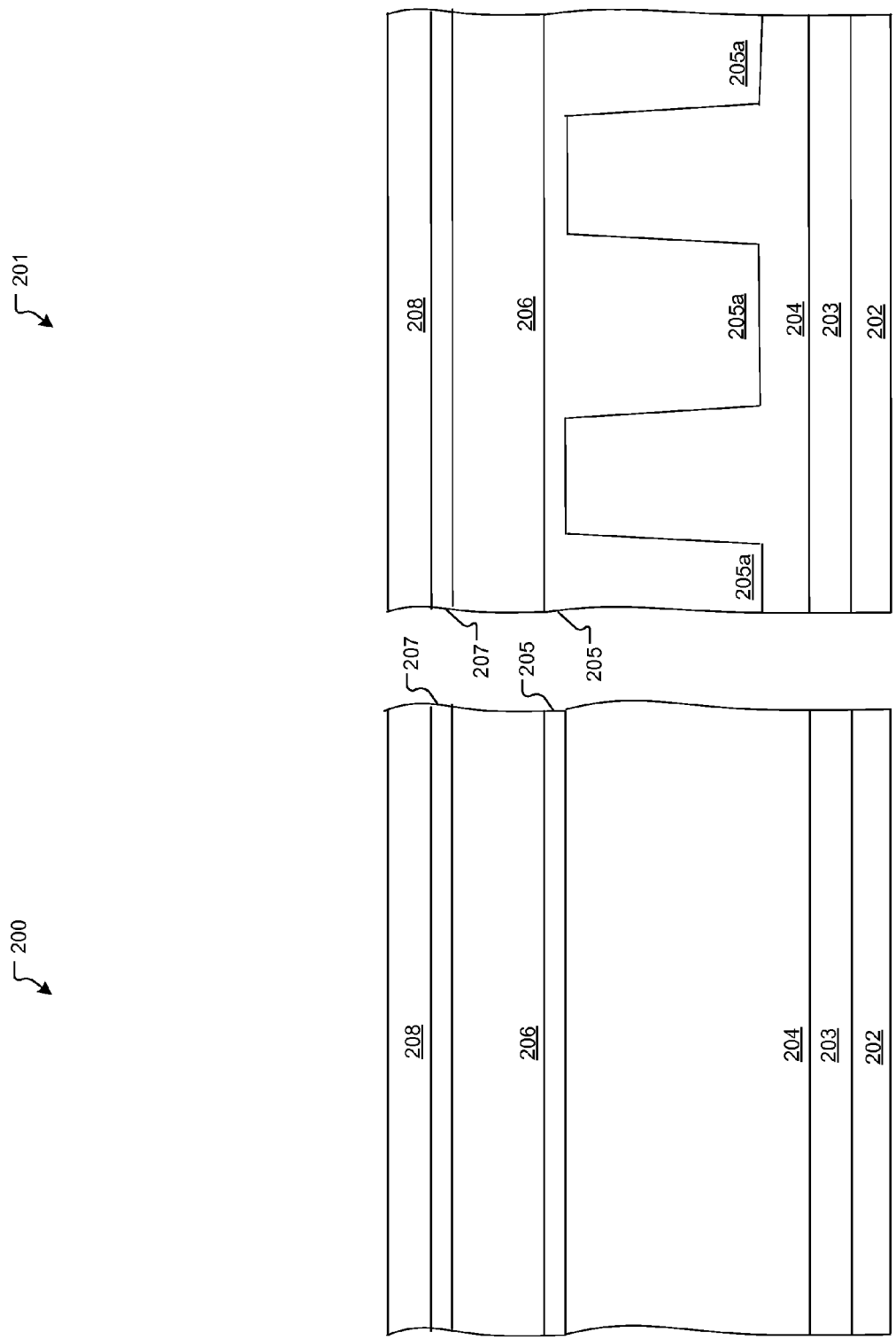

In FIG. 2A, the storage transistor includes a P-type substrate 202, an optional deep N-type well 203 layer, an optional P-type well layer 204, a first gate oxide layer 205, a shallow trench isolation (STI) oxide layer 205a, a first polysilicon layer 206, a pad oxide layer 207, and a nitride layer 208. Since the first gate oxide layer 205 and the STI oxide layer 205a are both oxide layers, no boundary between the two is shown in the figure. The STI oxide layer 205a can be formed by standard STI process steps to define diffusion areas.

The first gate oxide layer 205 can be, e.g., 5-20 nm thick. The first polysilicon layer 206 can be, e.g., 60-150 nm thick. The first polysilicon layer 206 can be in-situ doped polysilicon or undoped, e.g., with an implant formed in it. The pad oxide layer 207, which is optional, can be 1-20 nm thick. The nitride layer 208 can be, e.g., 20-200 nm thick.

Figure 2B:
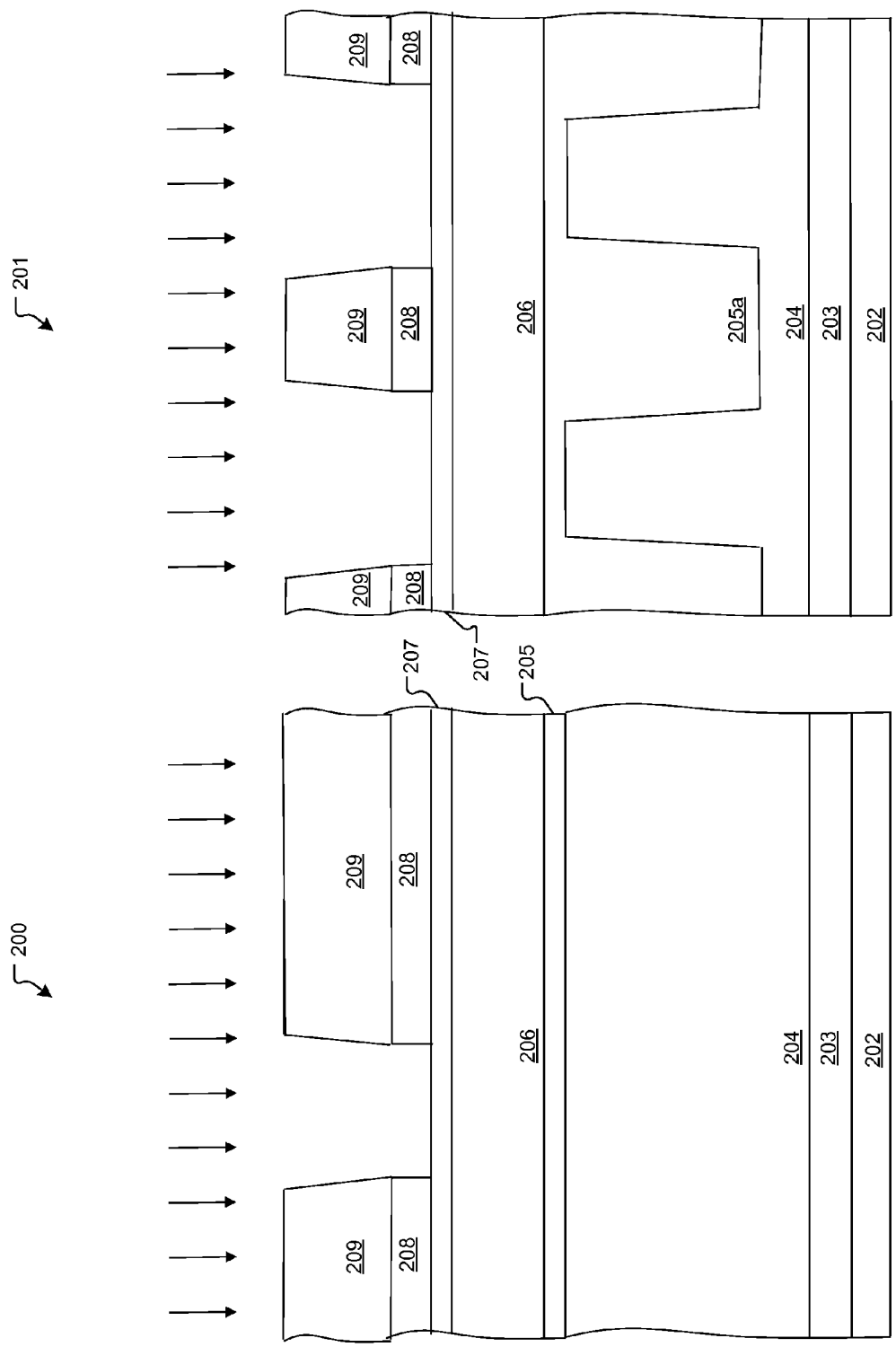
Figure 2C:
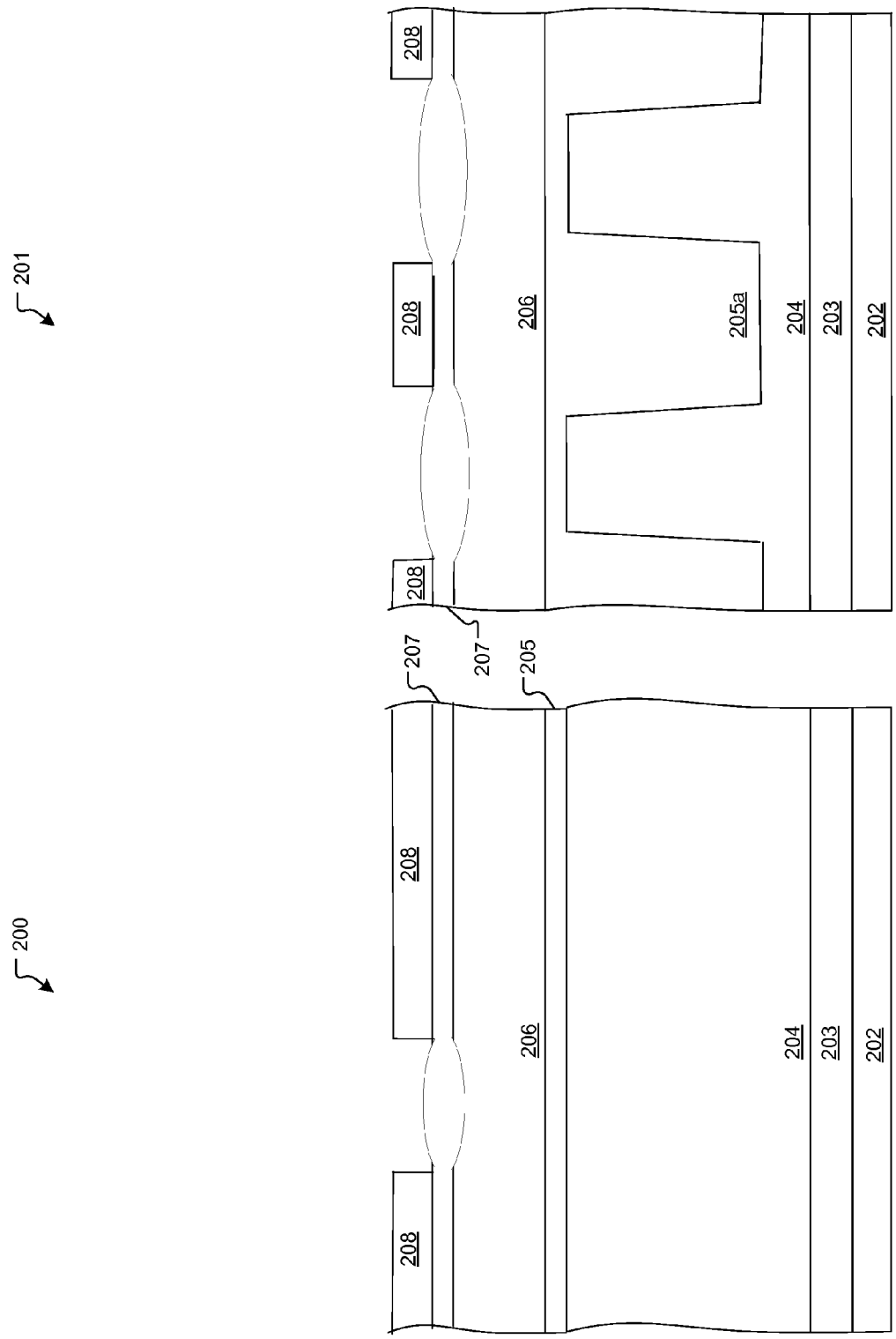
Figure 2D:
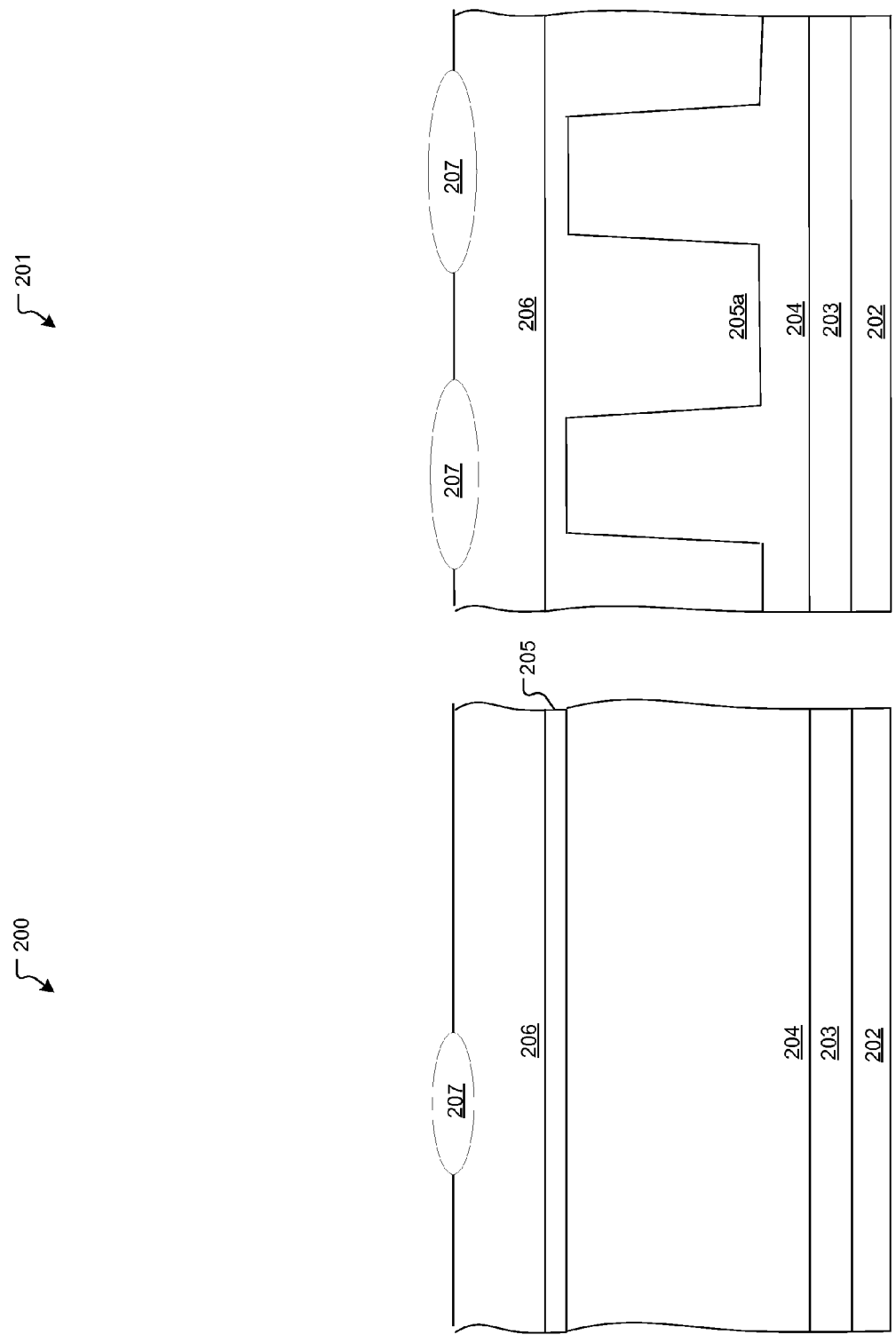

In FIG. 2B, a photoresist pattern is applied to define a floating gate opening. Then a dry nitride etch is performed, resulting in a patterned photoresist layer 209 on the patterned nitride layer 208. In FIG. 2C, the photoresist pattern is removed. A local oxidation technique is applied that causes the oxide layer 207 to form between the patterned areas of the nitride layer 208 with bird's beaks at nitride edges. The oxidation occurs in locations where nitride is not present because nitride is a good oxidation masking material. In FIG. 2D, the nitride layer 208 is removed, and the pad oxide layer 207 is optionally partially removed, leaving the oxide shapes 207 as shown in the figure. The process details can be varied so that the oxide shapes 207 can be sharp or rounded.

Figure 2F:
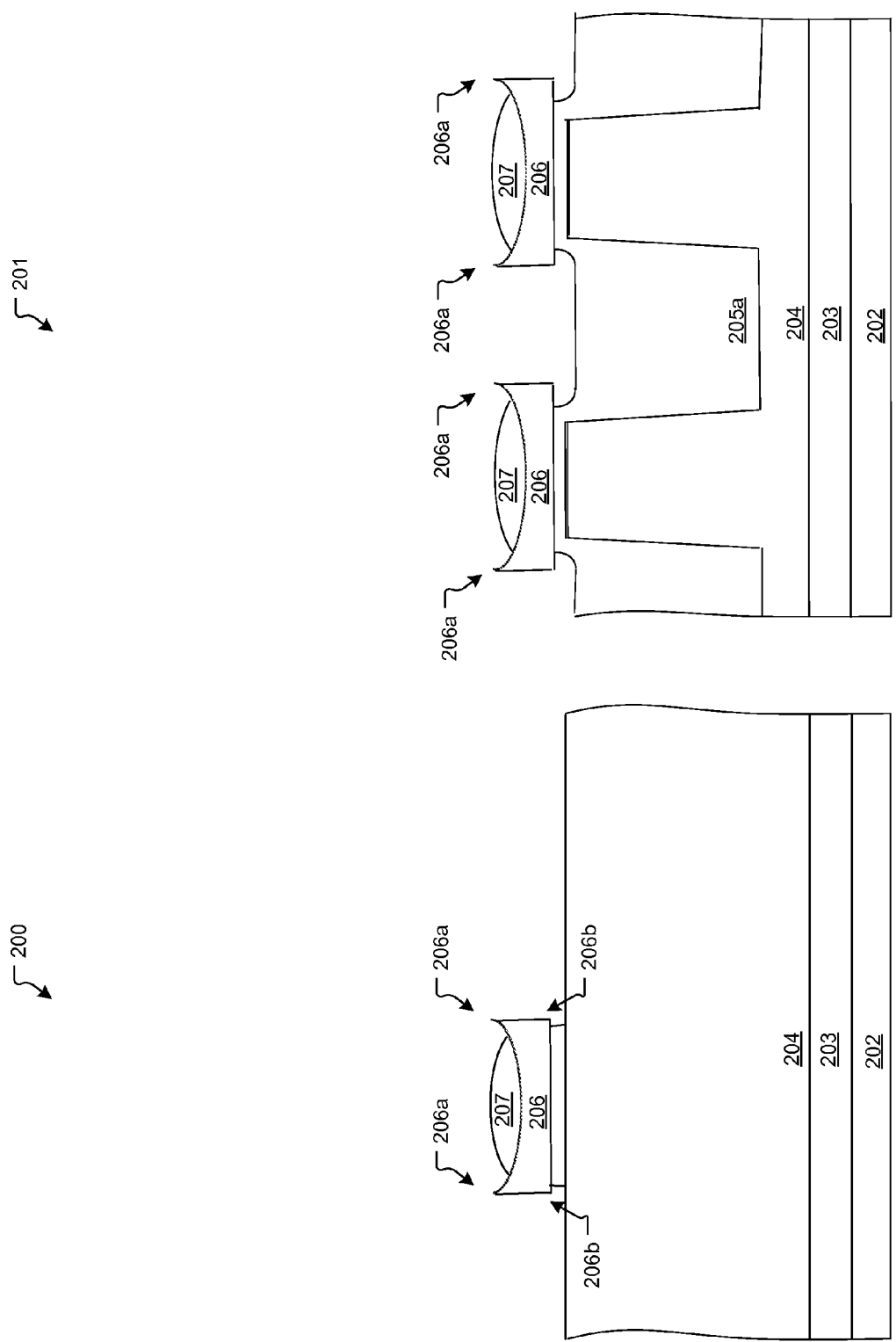

In FIG. 2E, an anisotropic dry poly etch with a high etch selectivity to oxide is performed, removing the portions of the first polysilicon layer 206 that are not beneath the first oxide layer 207. In FIG. 2F, a wet oxide etch is performed to expose sharp edges 206a in the first polysilicon layer 206. A sharp edge can be a portion of polysilicon having two sides tapering to an intersection at an angle, e.g., 89 degrees or fewer, or 45 degrees or fewer. The sharp edges 206a can concentrate an electric field and improve tunneling efficiency for programming storage transistors.

Sharp edges 206b may also be exposed at the bottom of the first polysilicon layer 206, near the STI oxide layer 205a. In some implementations, before or after the wet oxide etch, enhancement implants are formed for select transistors. Peripheral high voltage and low voltage N-type wells and P-type wells can be formed.

Figure 2G:
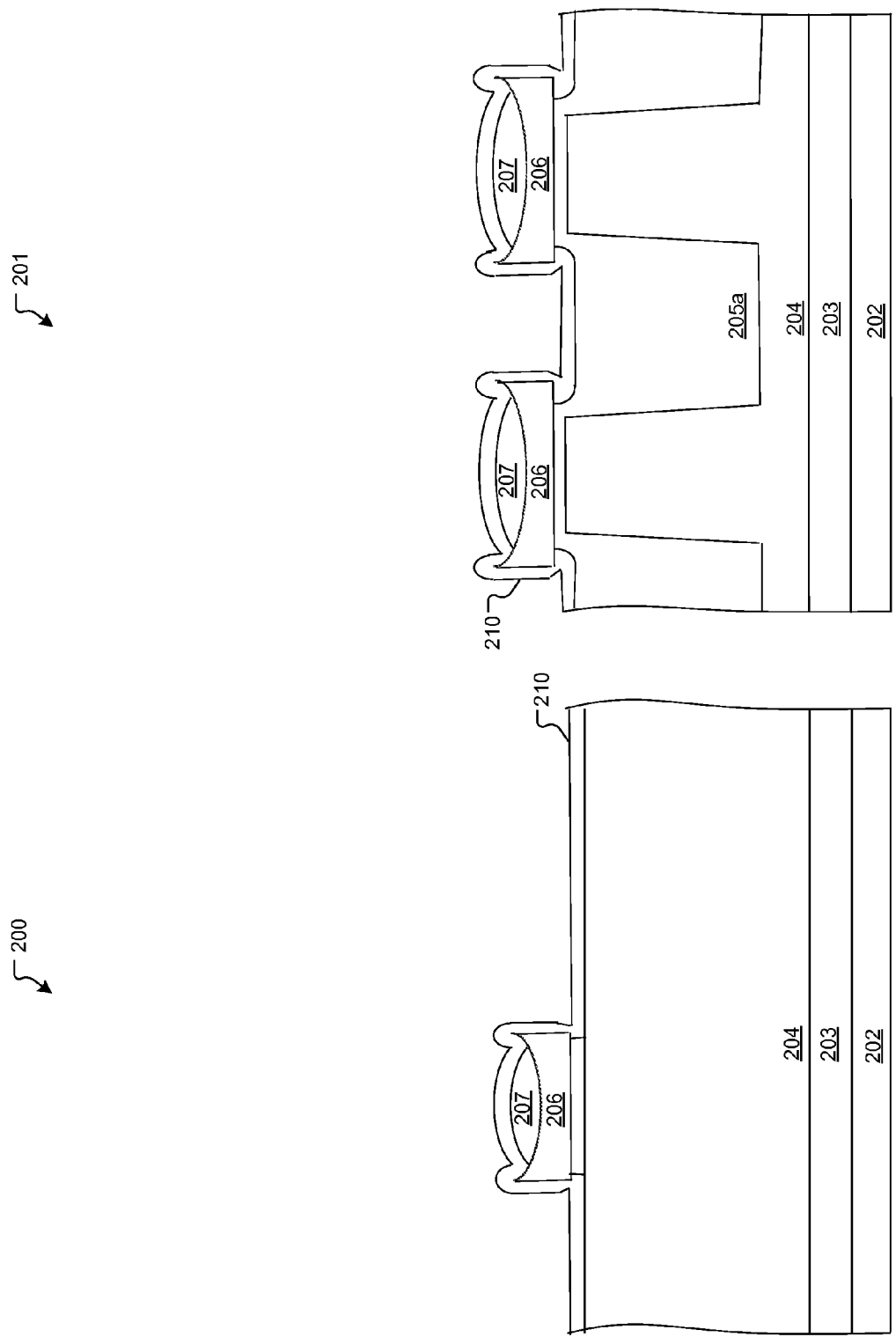
Figure 2H:
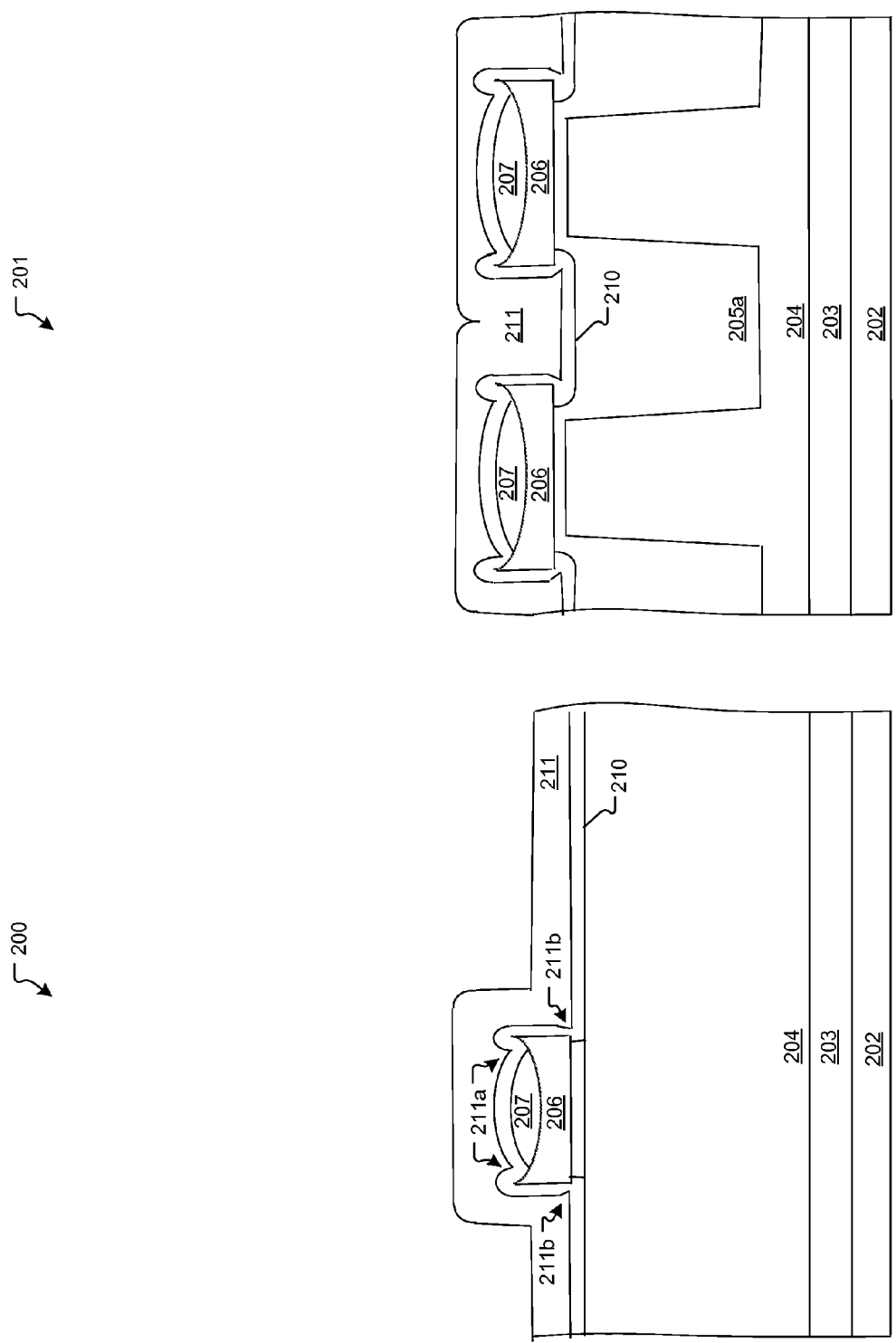

In FIG. 2G, a tunneling dielectric layer 210 is formed. The tunneling dielectric 210 layer can be, e.g., 10-20 nm thick. The tunneling dielectric layer 210 can be, e.g., a High Temperature Oxide (HTO) layer, a thermal oxide layer, a composite oxide layer, an oxynitride layer, and so on. In FIG. 2H, a second polysilicon layer 211 is formed. The second polysilicon layer 211 can be, e.g., 80-300 nm thick. The second polysilicon layer 211 can be in-situ doped polysilicon or undoped, e.g., with an implant formed in it.

As a result of the second polysilicon layer 211 forming over the tunneling dielectric layer 210, reverse sharp edges 211a and 211b can form. The reverse sharp edges can extend towards the first polysilicon layer 206 or fill a space surrounded by the first polysilicon layer. The reverse sharp edges 211a can enhance tunneling for performing erase operations on the storage transistor.

Figure 2I:
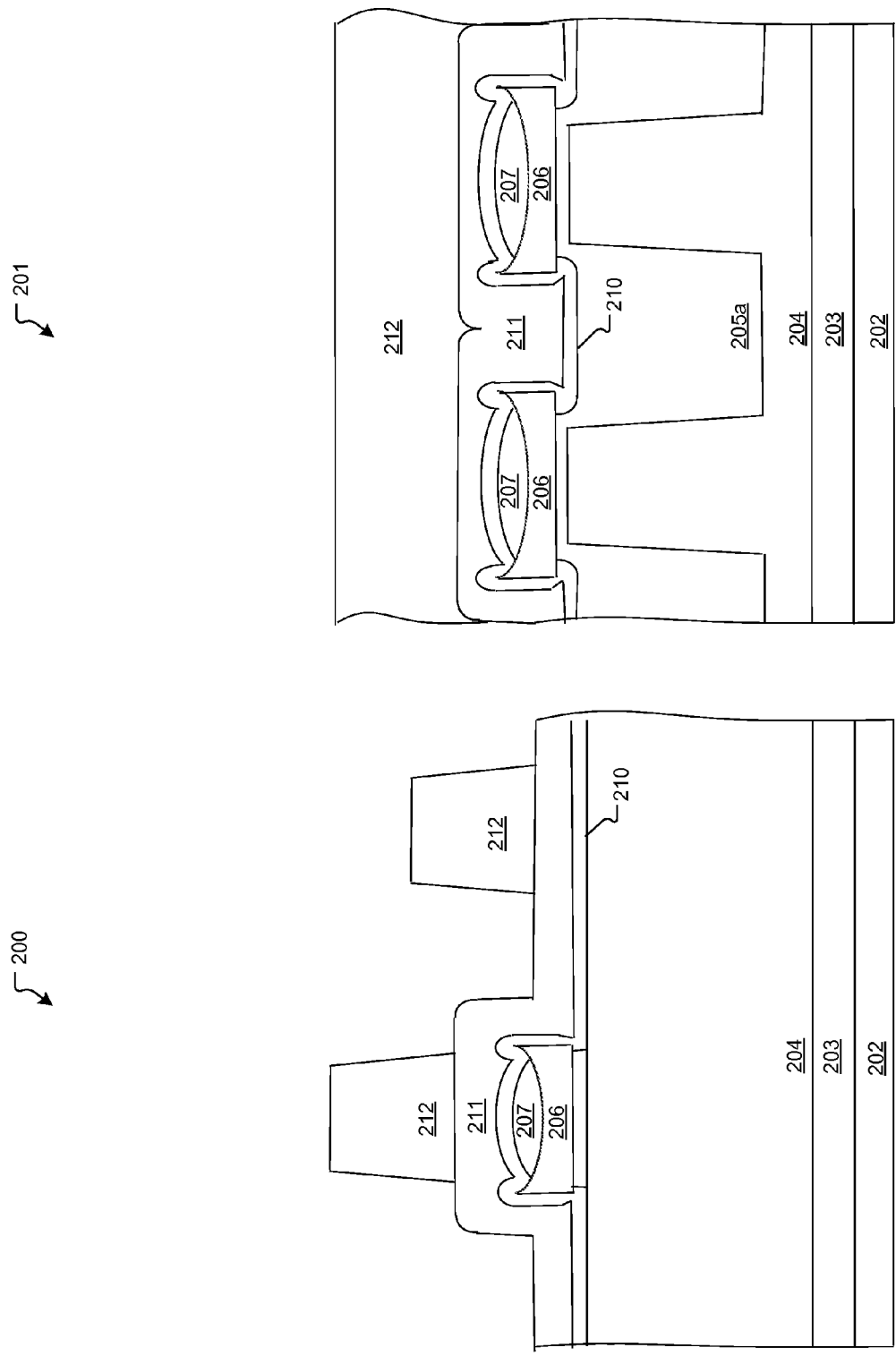
Figure 2J:
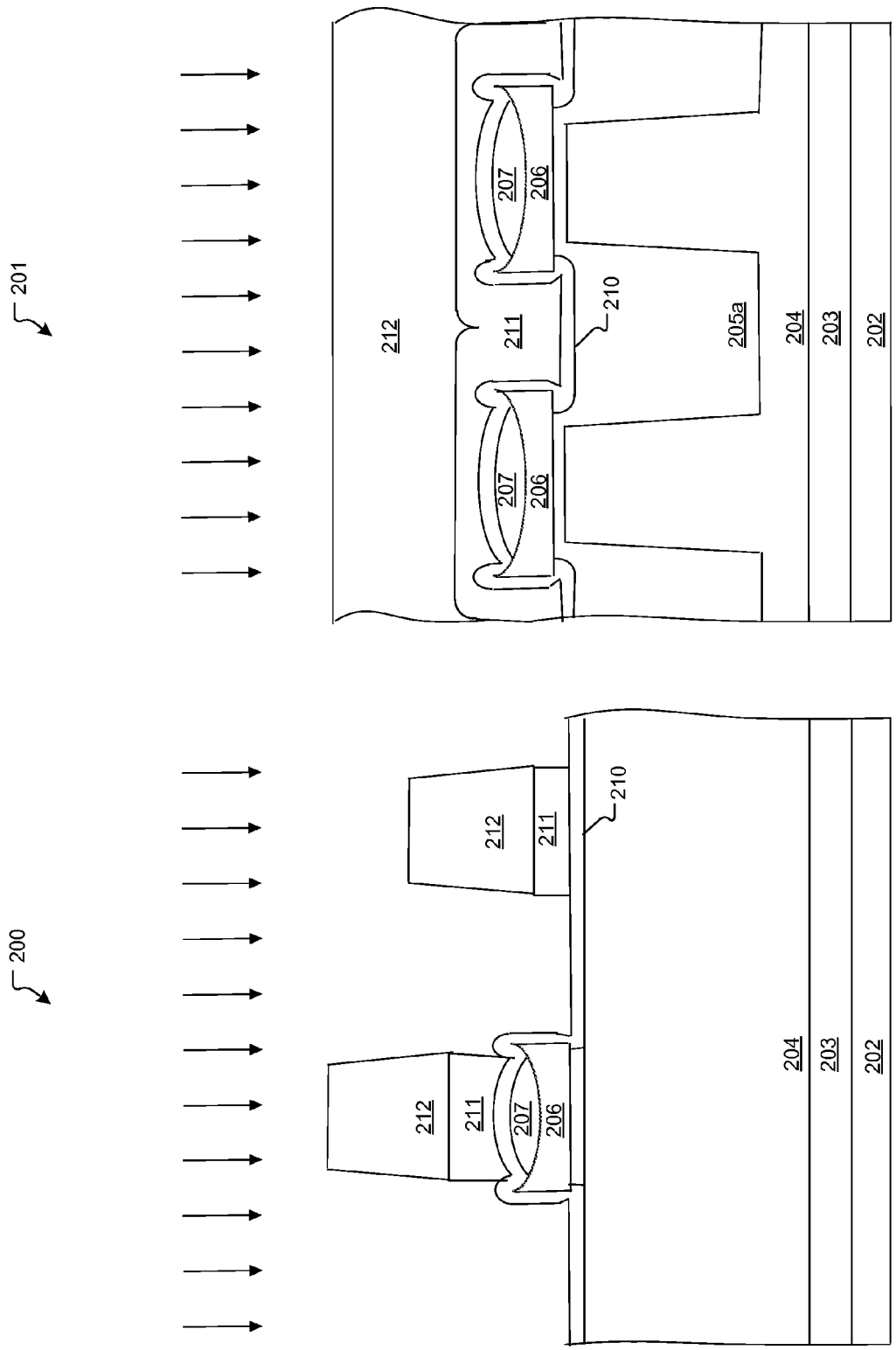
Figure 2K:
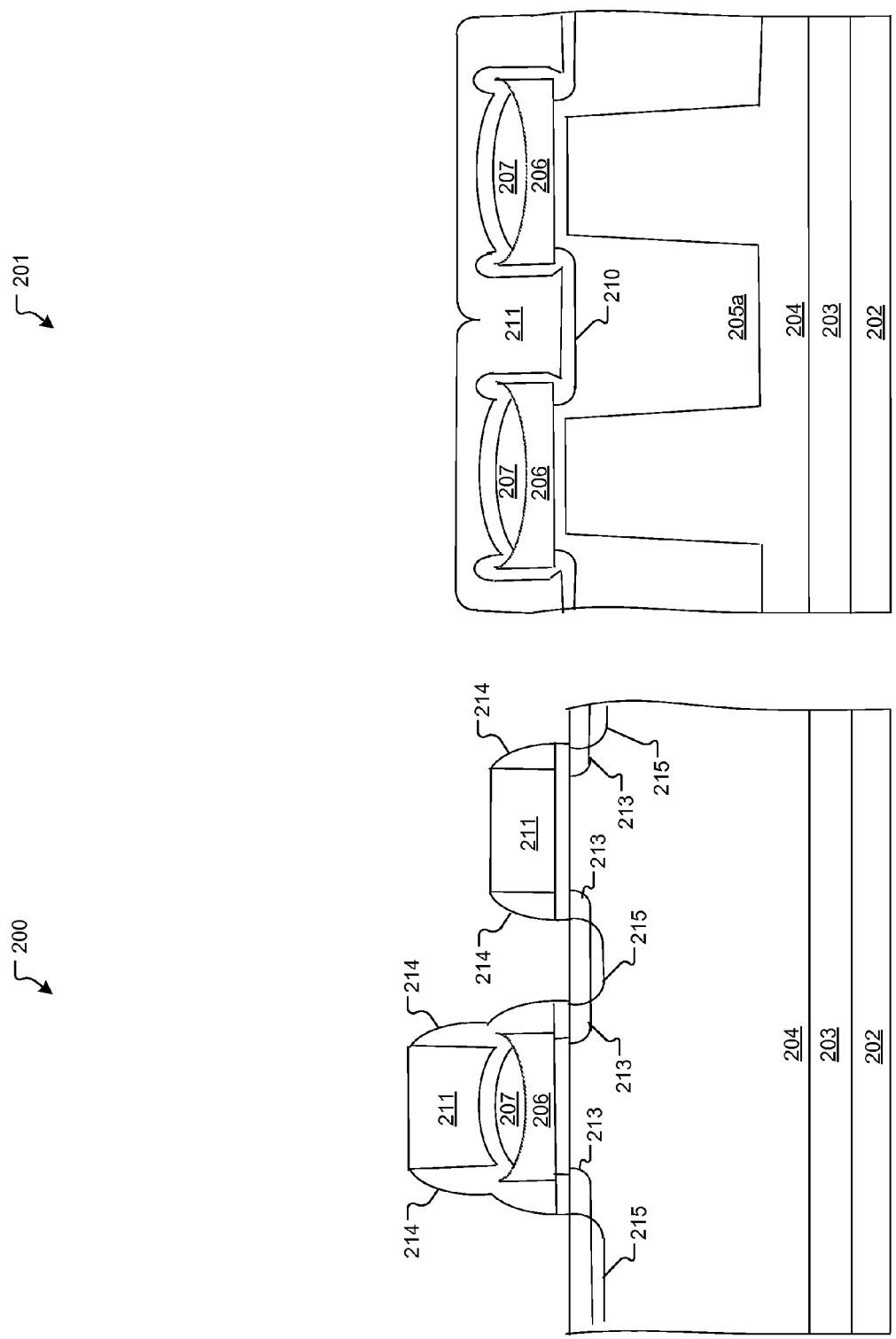

In FIG. 2I, a photoresist pattern 212 is applied to define features on the second polysilicon layer 211. The features can be, e.g., a select gate, a sense gate, one or more peripheral transistor gates, and so on. In FIG. 2J, a dry etch is performed to form the features on the second polysilicon layer 211. In FIG. 2K, the photoresist pattern 212 is removed. An N-type light doped drain (NLdd) layer 213 is added. For peripheral P-transistors, a P type light doped drain layer can be formed. Spacers 214 are formed. N+ source and drain implants 215 are formed. For peripheral P-transistors, P+ source and drain implants can be formed.

Figure 2L:
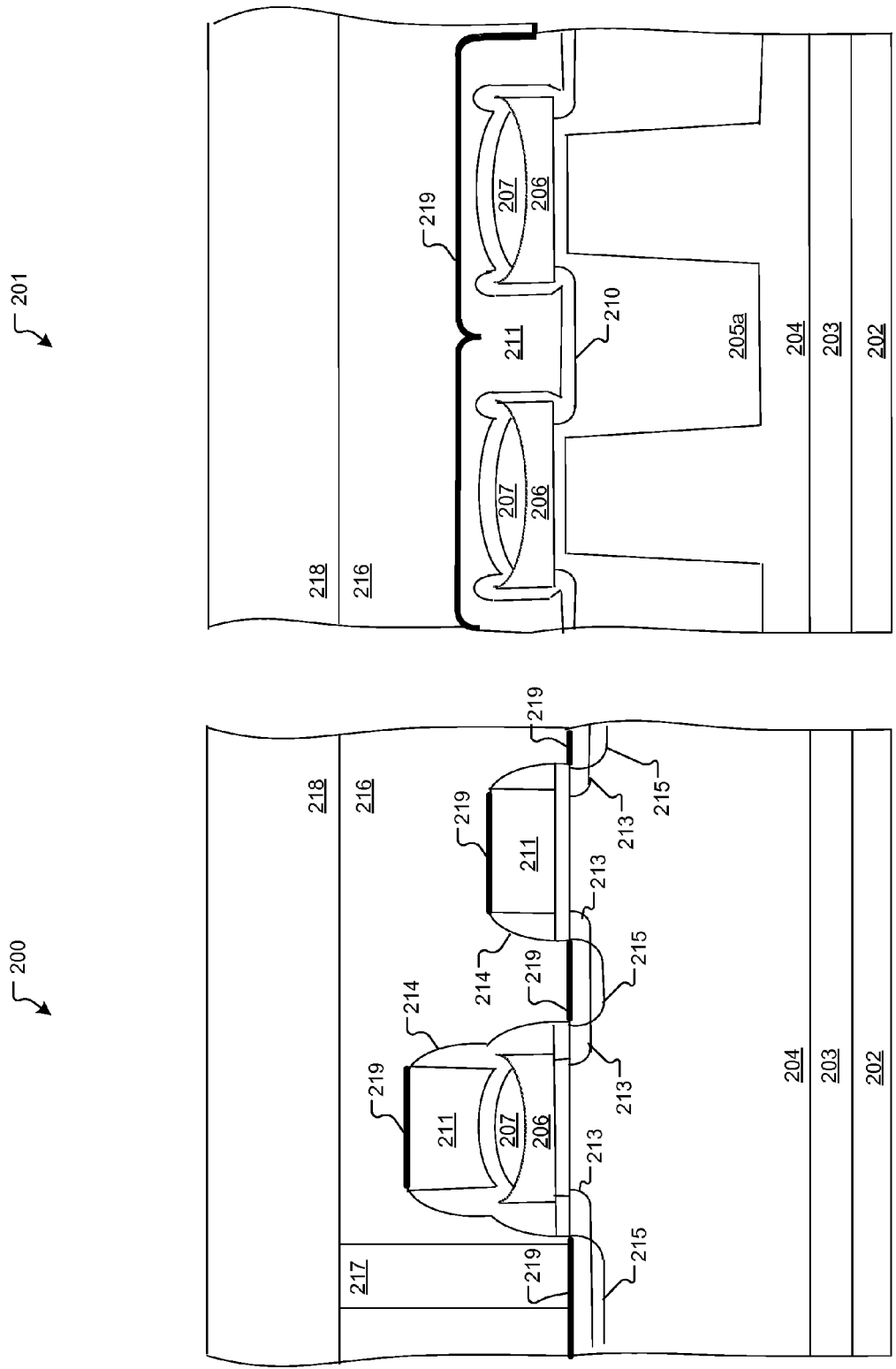

In FIG. 2L, a self-aligned silicide (salicide) layer 219 is formed. An interlayer dielectric layer 216 is formed. A contact 217 is formed. A first metal layer 218 is formed on top of the interlayer dielectric layer 216 and the contact 217. Other interconnect and passivation layers can be formed.

Figure 3:
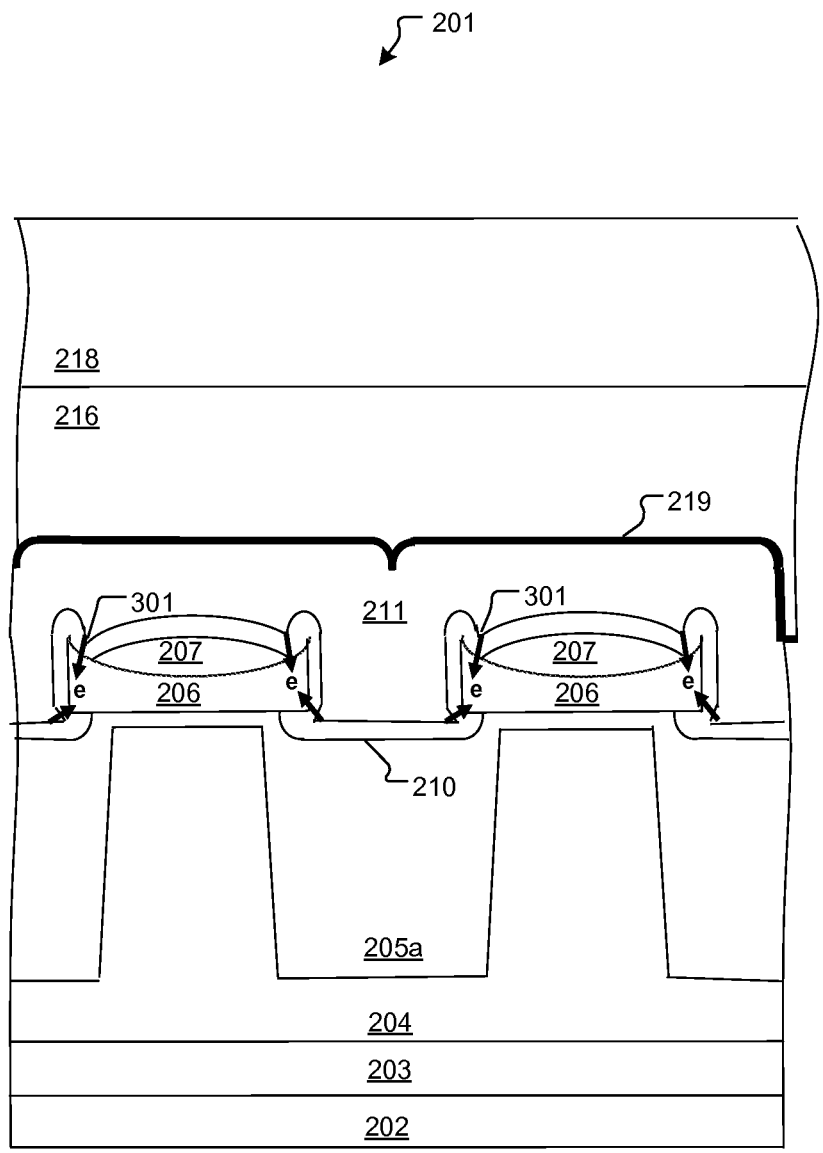
FIG. 3 is a diagram illustrating an erase operation for the storage transistor formed in FIGS. 2A-L.

FIG. 3 is a diagram illustrating an erase operation for the storage transistor formed in FIGS. 2A-L. The storage transistors are erased by injecting electrons 301 from the second polysilicon layer 211 to the first polysilicon layer 206 through the tunneling dielectric layer 210.

The storage transistor can be erased by appropriate bias conditions. Tables 1 and 2 list example erase bias conditions for the storage transistor.

TABLE 1

| Erase Bias Conditions I | |
|---|---|
| selected Sense Gate | (−8)-(−16 V) |
| unselected Sense Gate | 0 V or Floating |
| all Select Gates | 0 V or Floating |
| all Bit Lines | 0 V or Floating |
| P-Substrate or PWell | 0 V |
| Source line | 0 V or Floating |

TABLE 2

| Erase Bias Conditions II | |
|---|---|
| selected Sense Gate | 0 V |
| unselected Sense Gate | Floating |
| all Select Gates | 0 V or Floating |
| all Bit Lines | Same as PWell or Floating |
| PWell | 8-16 V |
| P-Substrate | 0 V |
| Source line | Same as PWell or Floating |

Figure 4:
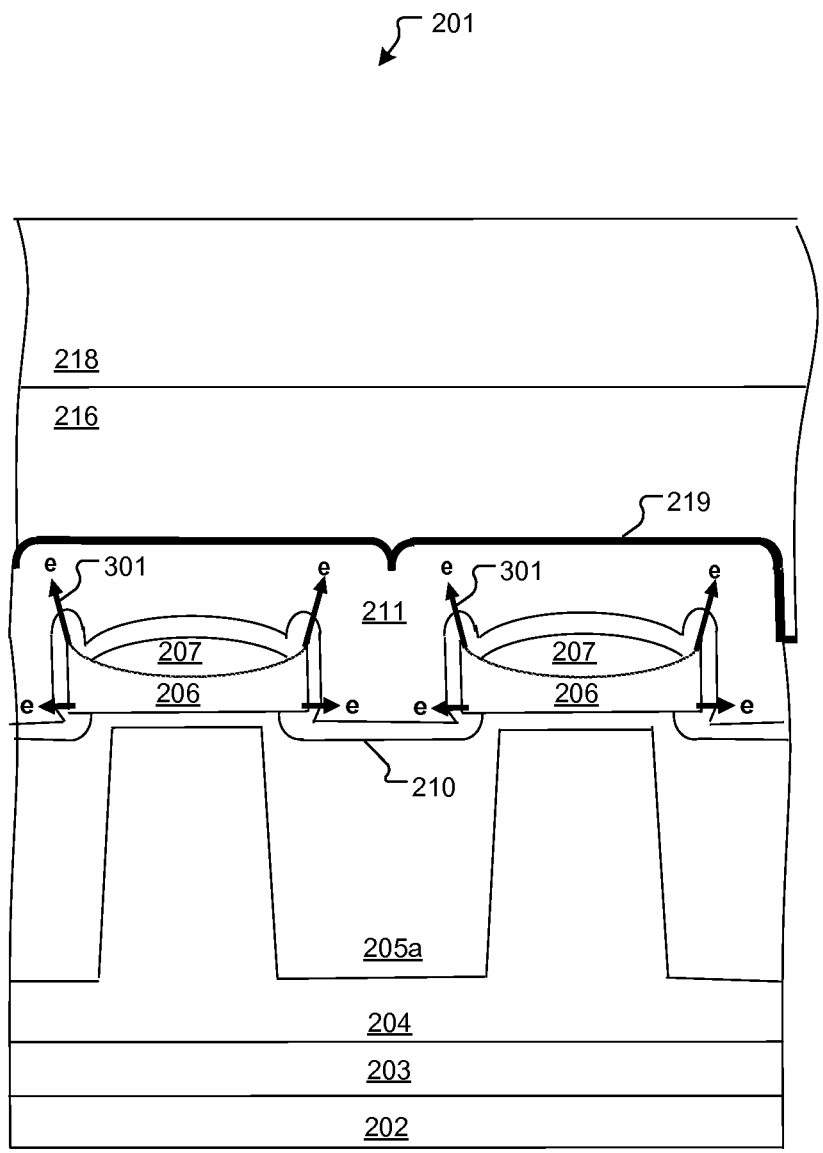
FIG. 4 is a diagram illustrating a program operation for the storage transistor formed in FIGS. 2A-L.

FIG. 4 is a diagram illustrating a program operation for the storage transistor formed in FIGS. 2A-L. During the program operation, the electrons 301 tunnel through the dielectric layer 210 from the first polysilicon layer 206 to the second polysilicon layer 211.

The storage transistor can be programmed by appropriate bias conditions. Table 3 lists example program bias conditions for the storage transistor. Selected memory bits in a bye, multiple bytes, a page, or a word line can be programmed at the same time. Within the same page to be programmed, an inhibit voltage is applied to all bit lines that are connected to unselected bits to prevent Fowler-Nordheim tunneling during programming.

TABLE 3

| Program Bias Conditions | |
|---|---|
| selected Sense Gate | 8-16 V |
| unselected Sense Gate | 0 V |
| selected Select Gate | 0 V |
| unselected Select Gate | 0 V |
| selected Bit Line | 0 V |
| unselected Bit Line | 4-12 V |
| P-Substrate or PWell | 0 V |
| Source line | 0 V or Floating |

By virtue of the sharp edges 206a and 206b of the first polysilicon layer 206 and the sharp edges 211a and 211b of the second polysilicon layer 211, the electric field concentrates at the edges during program and erase operations, respectively. This results in enhanced interpoly Fowler-Nordheim tunneling. Consequently, the tunneling dielectric layer 210 can be thicker than it is in some conventional storage transistors. Using a thicker tunneling dielectric layer 210 can improve the reliability of the storage transistor.

Figure 5:
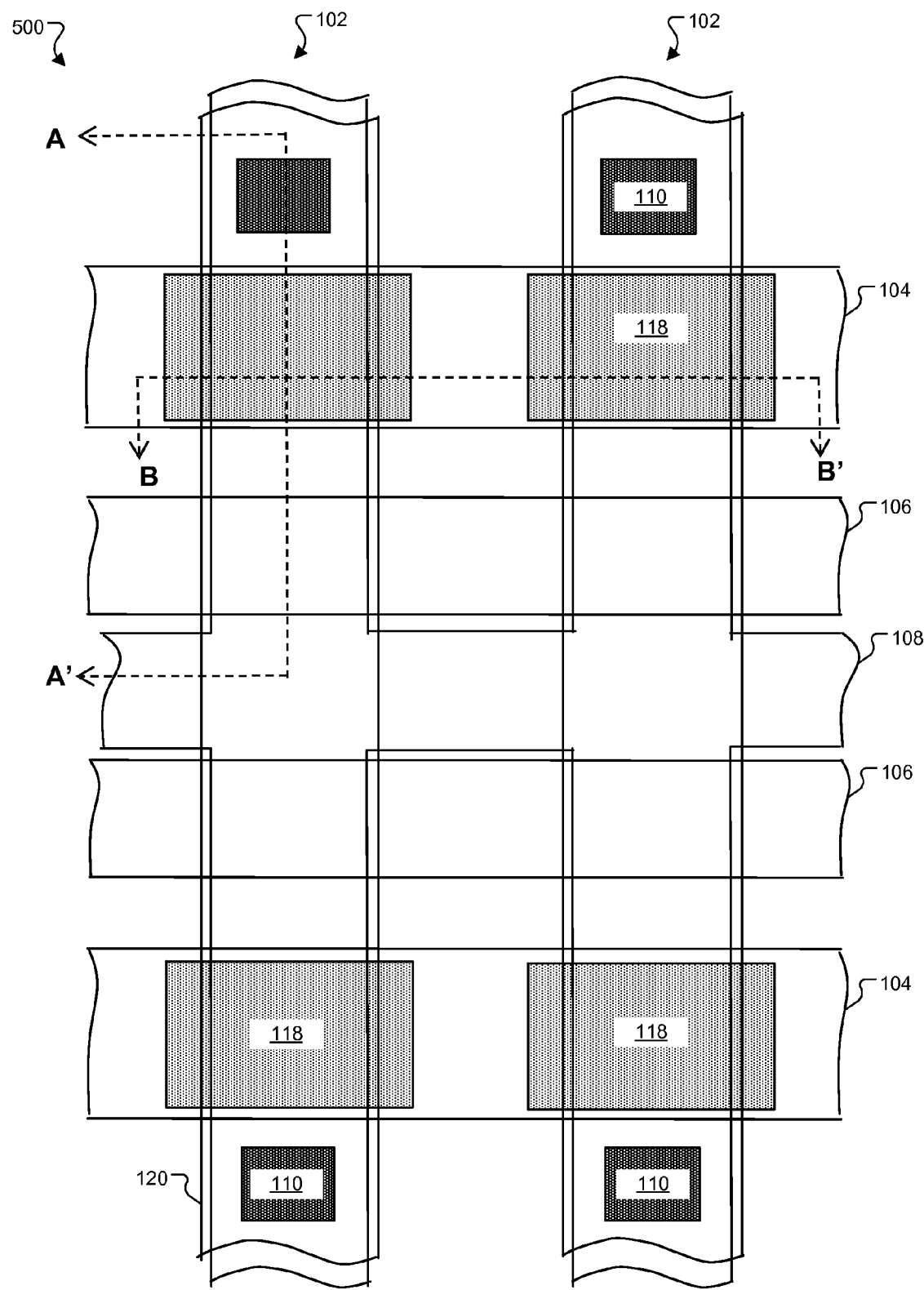
FIG. 5 is a top view of a first alternative example memory array.
Figure 6:
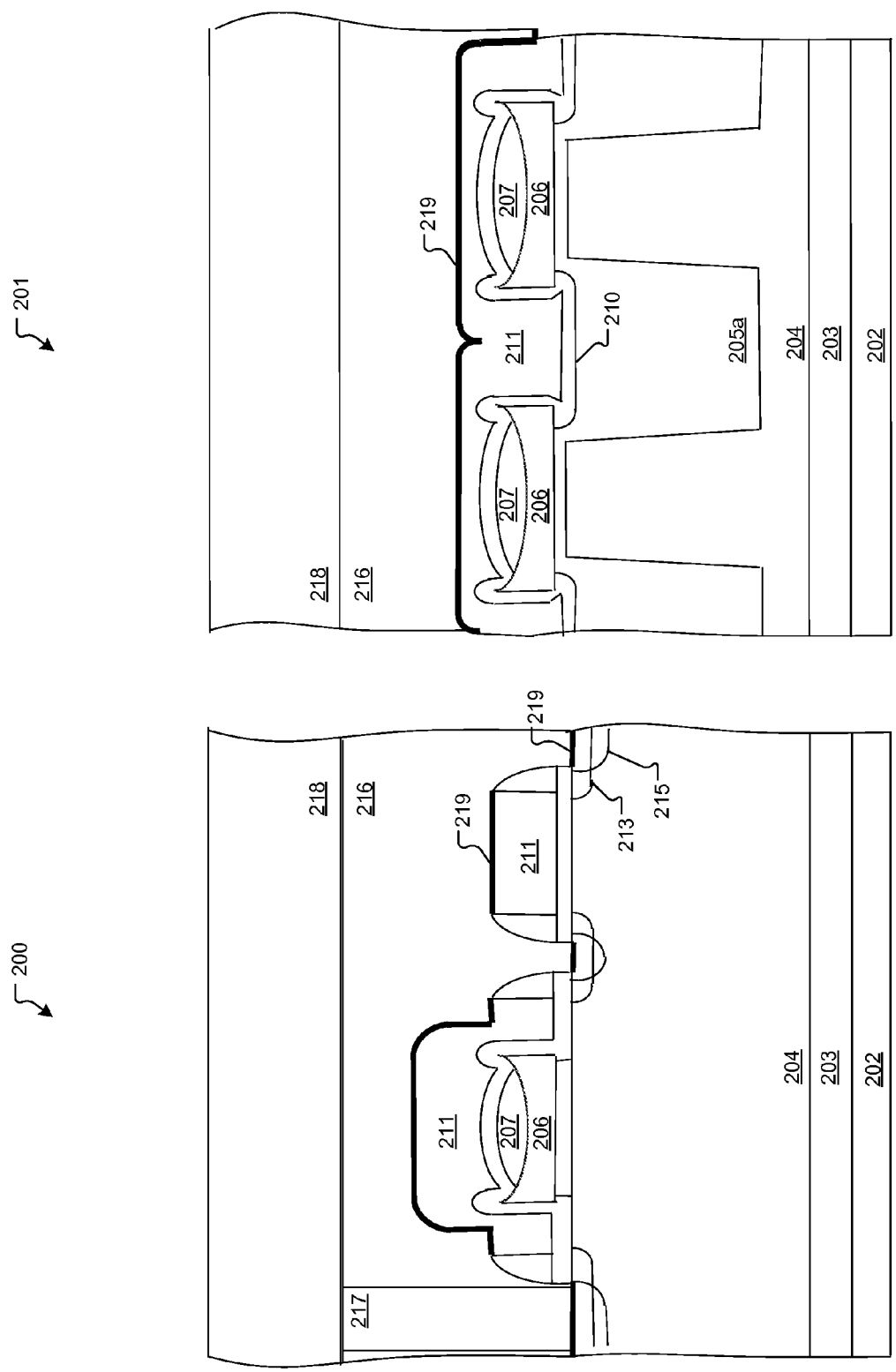
FIG. 6 shows cross sectional views of an example storage transistor from the first alternative example memory array.

FIG. 5 is a top view of a first alternative example memory array 500. Compared to the memory array 100 illustrated in FIG. 1B, the sense gates 112 of the first alternative example memory array 500 are fabricated wider than the floating gates 118. FIG. 6 shows cross sectional views 200 and 201 of an example storage transistor from the first alternative example memory array 500. As illustrated in the left side view 200, the second polysilicon layer 211 is wider than the first polysilicon layer 206. This is useful, e.g., because the tunneling edges are longer than those in the memory array 100 of FIG. 1B, but the coupling ratio may be higher, which can be worse for Fowler-Nordheim tunneling.

Figure 7:
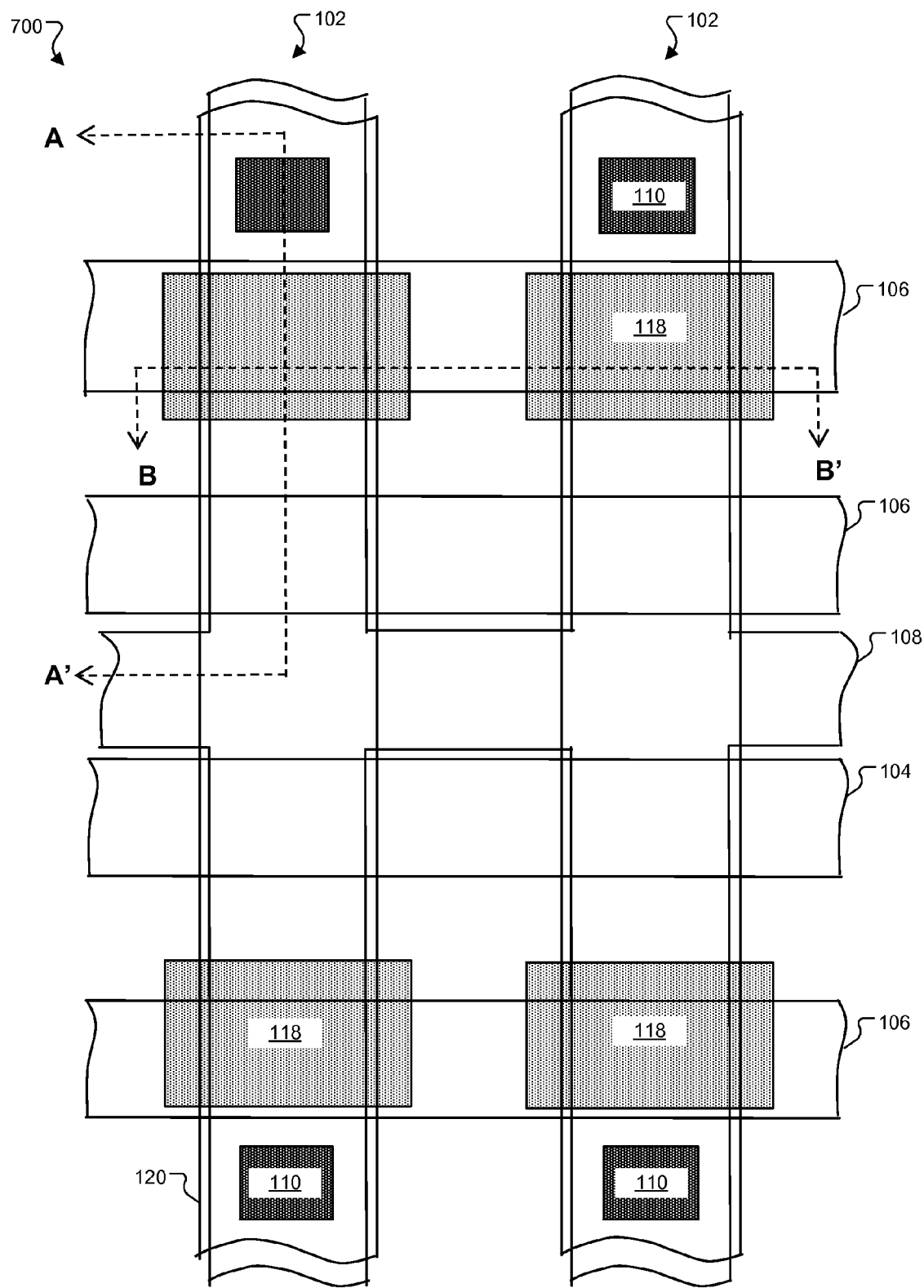
FIG. 7 is a top view of a second alternative example memory array.
Figure 8:
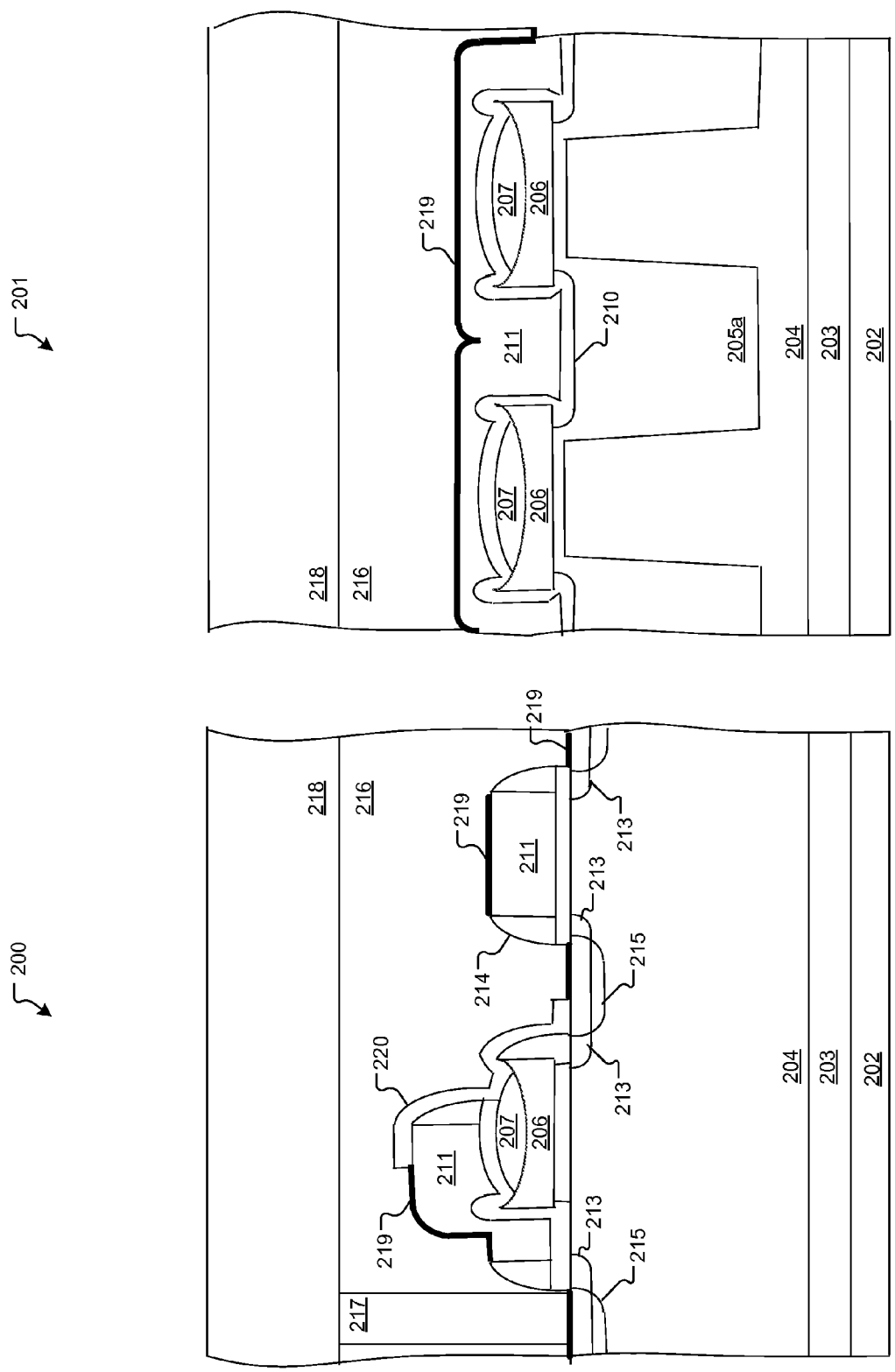
FIG. 8 shows cross sectional views of an example storage transistor from the second alternative example memory array.

FIG. 7 is a top view of a second alternative example memory array 700. Compared to the memory array 100 illustrated in FIG. 1B, the sense gates 112 of the first alternative example memory array 500 are fabricated to overlap the floating gates 118. The sense gates 112 are further from the select gates 114—leaving partial coverage from the drain side. FIG. 8 shows cross sectional views 200 and 201 of an example storage transistor from the second alternative example memory array 700. As illustrated in the left side view 200, a layer 220 of silicide blocking oxide or nitride partially covers the second polysilicon layer 211 and the first polysilicon layer 206 to prevent forming silicide on the floating gate.

Figure 9:
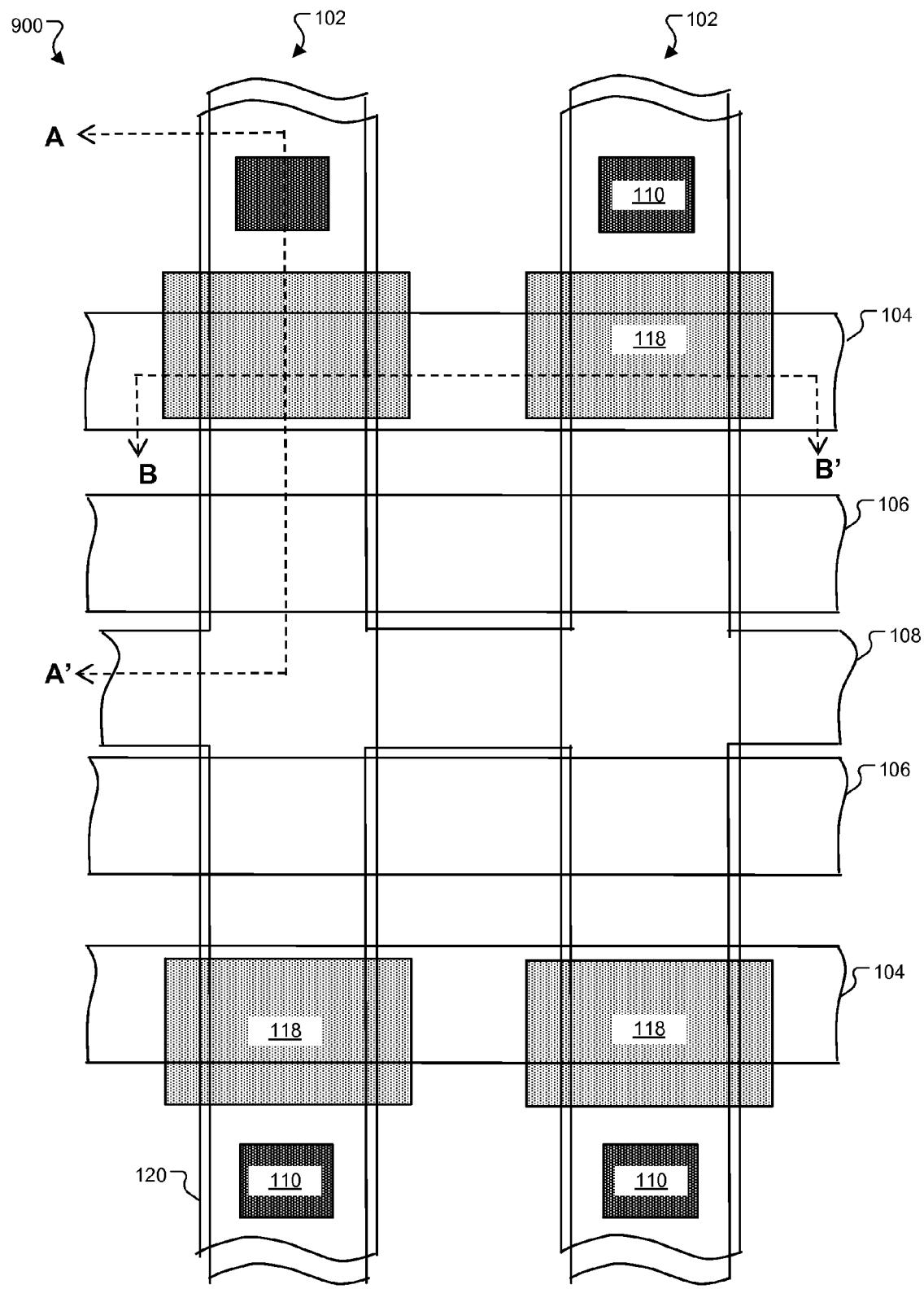
FIG. 9 is a top view of a third alternative example memory array.
Figure 10:
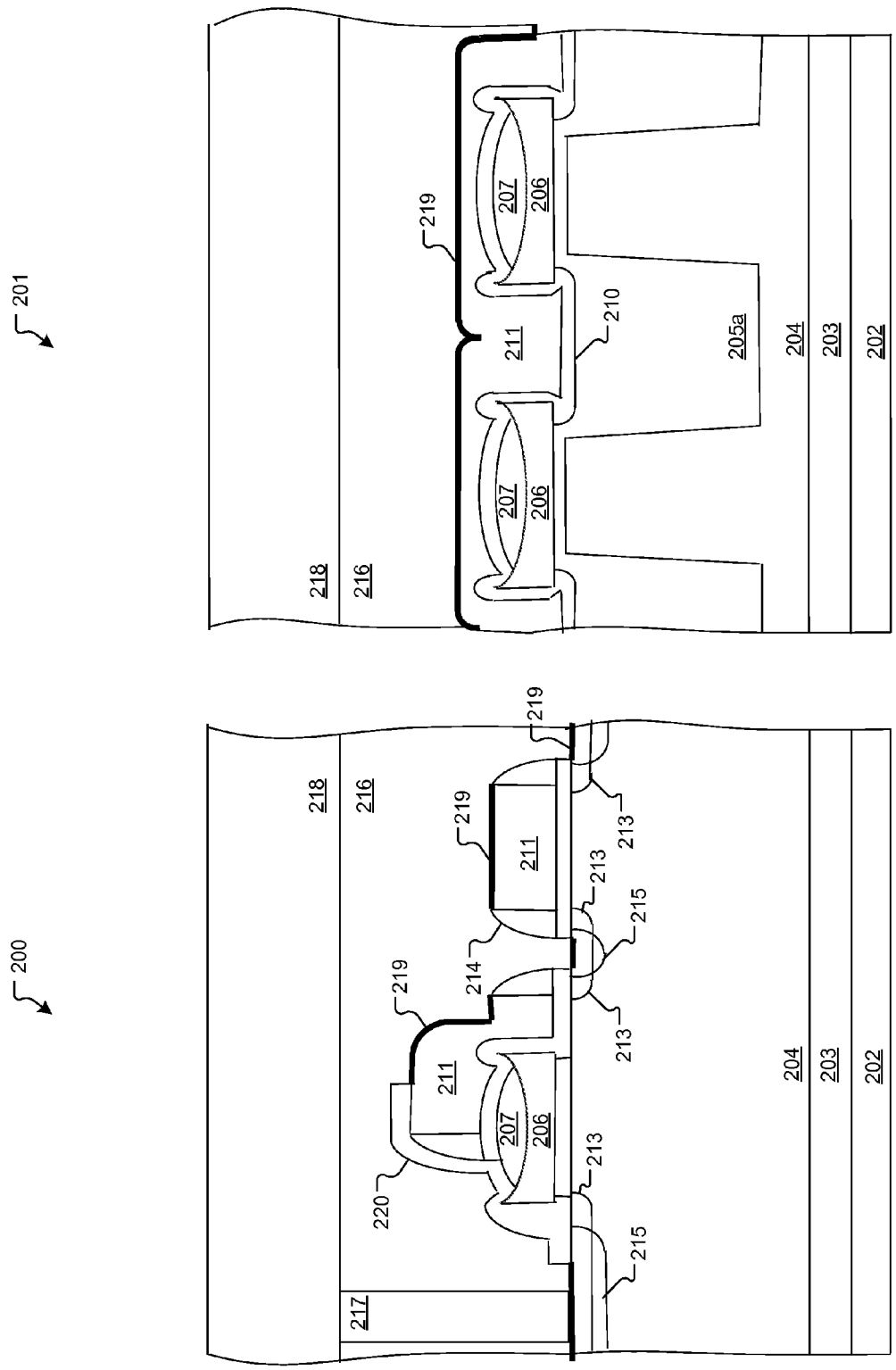
FIG. 10 shows cross sectional views of an example storage transistor from the first alternative example memory.

FIG. 9 is a top view of a third alternative example memory array 900. Compared to the memory array 100 illustrated in FIG. 1B, the sense gates 112 of the first alternative example memory array 500 are fabricated to overlap the floating gates 118. The sense gates 112 are closer to the select gates 114—leaving partial coverage from the source side. FIG. 10 shows cross sectional views 200 and 201 of an example storage transistor from the first alternative example memory 500. As illustrated in the left side view 200, a layer 220 of silicide blocking oxide or nitride partially covers the second polysilicon layer 211 and the first polysilicon layer 206 to prevent forming silicide on the floating gate.

While this document contains many specific implementation details, these should not be construed as limitations on the scope what may be claimed, but rather as descriptions of features that may be specific to particular embodiments. For example, N type semiconductors have been shown in some of the examples, but the technology can be applied to P type semiconductors. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A storage transistor comprising:
   a substrate;
   a first polysilicon layer over the substrate;
   an oxide layer disposed on top of the first polysilicon layer;
   a tunneling dielectric layer disposed on the first polysilicon layer and the oxide layer, wherein the oxide layer is between the first polysilicon layer and the tunneling dielectric layer; and
   a second polysilicon layer disposed on the tunneling dielectric layer, wherein the second polysilicon layer comprises at least a first edge extending into the tunneling dielectric layer towards the first polysilicon layer or filling a first space surrounded by the first polysilicon layer.

2. The storage transistor of claim 1, wherein the first edge comprises a portion of polysilicon having two sides tapering to an intersection at an angle of 89 degrees or fewer.

3. The storage transistor of claim 1, wherein the first polysilicon layer comprises at least a second edge extending towards the second polysilicon layer or filling a second space surrounded by the second polysilicon layer.

4. The storage transistor of claim 1, wherein the substrate is a P-type substrate.

5. The storage transistor of claim 1, wherein the substrate comprises:
   a deep N-type well region formed on a P-type substrate;
   a P-type well layer formed inside and isolated by the deep N-type well region; and
   a gate oxide layer formed on the P-type well layer, wherein the first polysilicon layer is disposed on the gate oxide layer.

6. The storage transistor of claim 1, wherein the oxide layer has a bird's beak shape formed by local oxidation on top of the first polysilicon layer.

7. The storage transistor of claim 1, comprising an n-type light doped drain (NLdd) layer and N+ source and drain implants.

8. The storage transistor of claim 1, comprising:
   a salicide layer disposed on the second polysilicon layer;
   an interlayer dielectric layer disposed on the salicide; and
   a contact adjacent to the salicide layer and the interlayer dielectric layer.

9. The storage transistor of claim 1, wherein the tunneling dielectric layer is 10-20 nm thick.

10. The storage transistor of claim 1, wherein the first polysilicon layer is 60-150 nm thick and the second polysilicon layer is 80-300 nm thick.

11. The storage transistor of claim 1, wherein the first polysilicon layer comprises at least a second edge, and wherein the first edge is formed based on the second edge and a shape of the oxide layer.

12. A storage transistor comprising:
   a substrate;
   a first polysilicon layer over the substrate;
   an oxide layer disposed on top of the first polysilicon layer;
   a tunneling dielectric layer disposed on the first polysilicon layer and the oxide layer, wherein the oxide layer is between the first polysilicon layer and the tunneling dielectric layer; and
   a second polysilicon layer disposed on the tunneling dielectric layer, wherein the second polysilicon layer comprises at least a first protrusion extending towards the first polysilicon layer.

13. The storage transistor of claim 12, wherein the first protrusion comprises a portion of polysilicon having two sides tapering to an intersection at an angle of 89 degrees or fewer.

14. The storage transistor of claim 12, wherein the first polysilicon layer comprises at least a second protrusion extending towards the second polysilicon layer.

15. The storage transistor of claim 12, wherein the substrate comprises:
a deep N-type well region formed on a P-type substrate;
a P-type well layer formed inside and isolated by the deep N-type well region; and
a gate oxide layer formed on the P-type well layer, wherein the first polysilicon layer is disposed on the gate oxide layer.

16. The storage transistor of claim 12, wherein the tunneling dielectric layer is 10-20 nm thick.

17. A method for producing a storage transistor, the method comprising:
forming a first polysilicon layer over a substrate;
forming an oxide layer on top of the first polysilicon layer;
forming a tunneling layer disposed on the first polysilicon layer and the oxide layer, wherein the oxide layer is between the first polysilicon layer and the tunneling layer; and
forming a second polysilicon layer disposed on the second polysilicon layer, wherein the second polysilicon layer comprises at least a first protrusion extending towards the first polysilicon layer.

18. The method of claim 17, further comprising:
removing portions of the first polysilicon layer that are not beneath the oxide layer using a dry polysilicon etch; and
exposing at least an edge in the first polysilicon layer using a wet oxide etch.

19. The method of claim 18, wherein the edge includes a portion of polysilicon having two sides tapering to an intersection at an angle of 89 degrees or fewer.

20. The method of claim 18, wherein the oxide layer has a bird's beak shape formed by local oxidation on top of the first polysilicon layer, and
wherein the first protrusion is formed based on a shape of the edge of the first polysilicon layer and the bird's beak shape of the oxide layer.

* * * * *